(12) United States Patent
Yu

(10) Patent No.: US 12,014,965 B2
(45) Date of Patent: Jun. 18, 2024

(54) THREE-DIMENSIONAL PACKAGING STRUCTURE AND METHOD FOR FAN-OUT OF BONDING WALL OF DEVICE

(71) Applicant: Xiamen Sky Semiconductor Technology Co. Ltd., Fujian (CN)

(72) Inventor: Daquan Yu, Fujian (CN)

(73) Assignee: Xiamen Sky Semiconductor Technology Co. Ltd., Fujian (CN)

( * ) Notice: Subject to any disclaimer, the term of this patent is extended or adjusted under 35 U.S.C. 154(b) by 286 days.

(21) Appl. No.: 17/666,904

(22) Filed: Feb. 8, 2022

(65) Prior Publication Data

US 2022/0165632 A1 May 26, 2022

Related U.S. Application Data

(63) Continuation of application No. PCT/CN2020/107866, filed on Aug. 7, 2020.

(30) Foreign Application Priority Data

Aug. 8, 2019 (CN) .......................... 201910730417.6

(51) Int. Cl.
*H01L 23/29* (2006.01)
*H01L 21/82* (2006.01)
(Continued)

(52) U.S. Cl.
CPC .......... *H01L 23/29* (2013.01); *H01L 21/8213* (2013.01); *H01L 23/49816* (2013.01); *H01L 24/04* (2013.01); *H01L 2224/04105* (2013.01)

(58) Field of Classification Search
CPC ... H01L 23/29; H01L 23/49816; H01L 24/04; H01L 21/8213
See application file for complete search history.

(56) References Cited

U.S. PATENT DOCUMENTS 6,727,576 B2   4/2004  Hedler et al.
2012/0074594 A1*  3/2012  Marutani ............ H01L 23/5389
257/782
(Continued)

FOREIGN PATENT DOCUMENTS

CN   106098645 A   11/2016
CN   106711105 A   5/2017
(Continued)

OTHER PUBLICATIONS

International Search Report and English Translation cited in PCT/CN2020/107866, mailed Nov. 11, 2020, 8 pages.
(Continued)

*Primary Examiner* — Nathan W Ha
(74) *Attorney, Agent, or Firm* — Cooper Legal Group, LLC

(57) ABSTRACT

Three-dimensional packaging structure for fan-out of bonding wall of device is provided. A first surface of a device is disposed with bond pads and functional area. The device, except for the first surface, is encapsulated with encapsulation material. A first surface of the encapsulation material horizontally connected to the first surface forms a fan-out surface. A wall structure is disposed on the first surface and extends to the fan-out surface. The wall structure partially covers at least one of the bond pads and comprises first opening corresponding to the at least one of the bond pads. Cover plate is bonded with the wall structure to form cavity corresponding to the functional area and comprises at least one second opening in communication with the first opening. A metal interconnection structure is disposed on surface of the cover plate and is electrically connected to the at least one of the bond pads.

17 Claims, 6 Drawing Sheets

(51) Int. Cl.
*H01L 23/00* (2006.01)
*H01L 23/498* (2006.01)

(56) References Cited

U.S. PATENT DOCUMENTS

| | | | | |
|---|---|---|---|---|
| 2015/0187710 A1* | 7/2015 | Scanlan | ............... | H01L 24/20 |
| | | | | 257/777 |
| 2015/0311147 A1* | 10/2015 | Wu | ............... | H01L 23/49833 |
| | | | | 257/693 |
| 2016/0051226 A1* | 2/2016 | Hong | ............... | B06B 1/0292 |
| | | | | 600/459 |
| 2016/0118323 A1* | 4/2016 | Pai | ............... | H01L 21/56 |
| | | | | 257/737 |
| 2016/0172402 A1* | 6/2016 | Katkar | ............... | H01L 24/20 |
| | | | | 257/292 |
| 2016/0276235 A1* | 9/2016 | Chen | ............... | H01L 24/24 |
| 2016/0276236 A1* | 9/2016 | Bang | ............... | H01L 21/486 |
| 2017/0005029 A1* | 1/2017 | Bang | ............... | H01L 21/565 |
| 2017/0062394 A1* | 3/2017 | Lin | ............... | H01L 23/36 |
| 2017/0194300 A1* | 7/2017 | Lin | ............... | H01L 24/19 |
| 2017/0229319 A1* | 8/2017 | Pai | ............... | H01L 24/17 |
| 2017/0236742 A1* | 8/2017 | Yota | ............... | H01L 21/6835 |
| | | | | 257/774 |
| 2018/0019177 A1* | 1/2018 | Harada | ............... | H01L 23/49838 |
| 2018/0090471 A1* | 3/2018 | Chiu | ............... | H01L 25/50 |
| 2018/0102322 A1* | 4/2018 | Kang | ............... | H01L 24/19 |
| 2018/0182727 A1* | 6/2018 | Yu | ............... | H01L 24/20 |
| 2018/0190558 A1* | 7/2018 | Hsu | ............... | H01L 23/3128 |
| 2018/0226356 A1* | 8/2018 | Ikeda | ............... | H01L 25/18 |
| 2018/0261550 A1* | 9/2018 | Cho | ............... | H01L 23/552 |
| 2018/0261573 A1* | 9/2018 | Chen | ............... | H01L 21/6835 |
| 2018/0288886 A1* | 10/2018 | Chen | ............... | H05K 3/4682 |
| 2018/0315674 A1* | 11/2018 | Chen | ............... | H01L 23/142 |
| 2018/0323119 A1* | 11/2018 | Kim | ............... | H01L 24/24 |
| 2018/0337142 A1* | 11/2018 | Cheng | ............... | H01L 23/04 |
| 2018/0366403 A1* | 12/2018 | Yu | ............... | H01L 23/147 |
| 2019/0019757 A1* | 1/2019 | Lee | ............... | H01L 23/49816 |
| 2019/0051614 A1* | 2/2019 | Dimaano, Jr. | ...... | H01L 23/3128 |
| 2019/0181117 A1* | 6/2019 | Huemoeller | ...... | H01L 23/49822 |
| 2019/0221446 A1* | 7/2019 | Huang | ............... | H01L 21/481 |
| 2019/0229078 A1* | 7/2019 | Kim | ............... | H01L 24/19 |
| 2019/0287890 A1* | 9/2019 | Harada | ............... | H01L 23/49861 |
| 2020/0027814 A1* | 1/2020 | Ichiryu | ............... | H01L 24/82 |
| 2020/0319049 A1* | 10/2020 | Qing | ............... | G01L 9/0042 |

FOREIGN PATENT DOCUMENTS

| | | |
|---|---|---|
| CN | 107342746 A | 11/2017 |
| CN | 208507655 U | 2/2019 |
| CN | 208848928 U | 5/2019 |
| CN | 208923109 U | 5/2019 |
| CN | 110729255 A | 1/2020 |
| CN | 210200699 U | 3/2020 |

OTHER PUBLICATIONS

Written Opinion and English Translation cited in PCT/CN2020/107866, mailed Nov. 11, 2020, 9 pages.

* cited by examiner

THREE-DIMENSIONAL PACKAGING STRUCTURE AND METHOD FOR FAN-OUT OF BONDING WALL OF DEVICE

RELATED APPLICATIONS

This application is a continuation of and claims priority to International patent application number PCT/CN2020/107866, filed Aug. 7, 2020, which claims priority to Chinese patent application number 201910730417.6, filed on Aug. 8, 2019. International patent application number PCT/CN2020/107866 and Chinese patent application number 201910730417.6 are incorporated herein by reference.

FIELD OF THE DISCLOSURE

The present disclosure relates to the field of semiconductor packaging, and in particular to a three-dimensional packaging structure and method for fan-out of a bonding wall out of a device.

BACKGROUND OF THE DISCLOSURE

For many microelectromechanical systems (MEMS), such as accelerometers, radio frequency (RF) switches, gyroscopes, and various sensors, such as filters, complementary metal-oxide-semiconductor (CMOS) image sensors, it is necessary to form a protective cavity to protect a device and provide a vacuum or airtight working environment for the device. With the development of technology, the size of a chip is getting smaller and smaller, and for many devices, such as surface acoustic wave (SAW) filters and CMOS image sensors, the sealing wall for individual die can only be disposed outside the function area of the device. In order to reduce the cost, an area used to form the sealing wall should become smaller and smaller, causing a width of the sealing wall to become narrower and narrower. The reduction of a bonding area between the sealing wall and the device as well as the sealing wall and the cover plate reduces a bonding force of a bonding interface, which has a great influence on a reliability of the device. Therefore, new low-cost, high-reliability solutions must be found.

Fan-out packaging technologies are currently mainstream advanced packaging technologies. With the further improvement of chip integration and the further increase of the number of inputs/outputs (I/Os), traditional Wafer Level Chip Scale Packaging (WLCSP) is difficult to meet product requirements. It is necessary to solve the contradiction between the excessive number of I/Os and the small chip area in WLCSP. Infineon proposed wafer-level fan-out eWLB (Embedded Wafer Level BGA) technology in 2004 (U.S. Pat. No. 6,727,576B2). The main feature of this technology is to construct a new fan-out plane around the chip using a molding compound and a surface of the chip and to lead metal wiring from the chip to the fan-out plane. The fan-out packaging technologies are no longer limited by chip size in principle, and the number of I/Os and solder ball pitches can no longer be limited by chip size. Since a substrate is not used, the thickness of the package is reduced, which has excellent cost saving and electrical advantages. However, in the fan-out packaging technologies of the prior art, the fan-out part is a planar structure, which is mostly used for circuit layout using redistribution metal lines, and the process is complicated.

With the gradual maturity of Fan-out Wafer Level Packaging (FOWLP) technology, the continuous reduction of costs, and the continuous improvement of chip technologies, FOWLP will experience explosive growth. In order to pitch the thickness of the traditional Adjunct Processor (AP) package-on-package (PoP) package and improve the electrical performance, the three-dimensional FOWLP stacking technologies of making through-hole interconnections on the molding compound has been further developed based on the FOWLP technologies. The representative structure is integrated fan-out (InFO) technology developed by TSMC, which provides packaging services for Apple's A10, A11, and A12 processors, which has spurred the upsurge of the entire industry to develop three-dimensional (3D) FOWLP stacking technology.

BRIEF SUMMARY OF THE DISCLOSURE

The present disclosure provides a three-dimensional packaging structure and a three-dimensional packaging method for fan-out of a bonding wall to form the sealing of the device to solve the deficiencies in the background to improve reliability, reduce failure risk, and reduce cost.

In order to solve the technical problem, a first technical solution of the present disclosure is as follows.

A three-dimensional packaging structure for fan-out of a bonding wall of a device is provided. A first surface of a device has a plurality of bond pads and a functional area. The device, except for the first surface of the device, is encapsulated with an encapsulation material that is integrally molded, and a first surface of the encapsulation material horizontally connected to the first surface of the device forms a fan-out surface. A wall structure is disposed on the first surface of the device and extends into the fan-out surface, and the wall structure partially covers at least one of the plurality of bond pads and comprises a first opening corresponding to the at least one of the plurality of bond pads. A cover plate is bonded with the wall structure to form a cavity corresponding to the functional area and comprises at least one second opening contacting with the first opening, and a metal interconnection structure is disposed on a surface of the cover plate and is electrically connected to the at least one of the plurality of bond pads through the first opening and the at least one second opening.

In a preferred embodiment, the cover plate is made of polymer film, glass, silicon, or ceramic.

In a preferred embodiment, a material of the wall structure is polymer, glass, ceramic, or insulator.

In a preferred embodiment, a material of the wall structure is photoresist or dry film. The material of the wall structure is disposed on the first surface of the device and the fan-out surface by glue brushing or film laminating, and the wall structure is formed by photolithography, exposure, and development.

In a preferred embodiment, a material of the device is lithium niobate, lithium tantalate, glass, or silicon.

In a preferred embodiment, the encapsulation material is a polymer, a molding compound, an epoxy resin, or a glass paste.

In a preferred embodiment, the metal interconnection structure comprises a conductive circuit, a passivation layer, and one or more signal terminals. The conductive circuit is insulated from the cover plate, and the conductive circuit is disposed on a surface of the cover plate and extends to the at least one second opening and the first opening to be electrically connected to the plurality of bond pads. The passivation layer covers exposed surfaces of the cover plate and the conductive circuit and comprises a third opening, and the one or more signal terminals is located at the third opening to be electrically connected to the conductive circuit.

In a preferred embodiment, the one or more signal terminals are ball grid array (BGA solder balls), nickel-palladium-gold bond pads, nickel-gold bond pads, or titanium-copper bond pads.

In a preferred embodiment, the device is a filter chip with the plurality of bond pads disposed on the first surface of the device, and the wall structure is a frame structure. An inside of the wall structure correspondingly extends to cover each of the plurality of bond pads, and each of the plurality of bond pads is provided with the first opening.

A second technical solution of the present disclosure is as follows.

A three-dimensional packaging method for fan-out of a bonding wall of a device, comprising: 1) dicing a device wafer; 2) placing a device on a temporary carrier by picking and placing after dicing the device wafer; 3) encapsulating the device to form a fan-out surface that is defined by a first surface of an encapsulation material horizontally connected with a first surface of the device; 4) separating the device, that has been encapsulated, from the temporary carrier to obtain a reconstituted wafer or square plate with the encapsulation material; 5) fabricating a wall structure on an edge of the first surface of the device and the fan-out surface, the wall structure partially extending to cover at least one of a plurality of bond pads of the device, and the wall structure comprising a first opening corresponding to the at least one of the plurality of bond pads; 6) adding a cover plate on a surface of the wall structure to form a cavity corresponding to a functional area, the cover plate comprising a second opening corresponding to the at least one of the plurality of bond pads; and 7) fabricating a metal interconnection structure electrically connected with the plurality of bond pads.

In a preferred embodiment, the step 3 comprises: encapsulating the device by plastic encapsulation, film laminating, or glue brushing.

In a preferred embodiment, a material of the wall structure is photoresist or dry film, and the step 5 comprises: placing the material of the wall structure on the first surface of the device and the fan-out surface by glue brushing or film laminating, and forming the wall structure by photolithography, exposure, and development.

In a preferred embodiment, when the wall structure undergoes photolithography, the wall structure covers a part of an area of the at least one of the plurality of bond pads, and the first opening is reserved. When the cover plate has been bonded, the second opening is formed by the cover plate being opened at a position corresponding to the at least one of the plurality of bond pads through photolithography or laser, and the at least one of the plurality of bond pads is led to a surface of the cover plate through wires that are prepared through physical vapor deposition (PVD) or electroplating.

Compared with the existing techniques, the technical solution has the following advantages.

1. The present disclosure adopts the encapsulation material to encapsulate the device, except for the first surface of the device, to form the fan-out surface, and the three-dimensional packaging structure comprises the wall structure disposed on the fan-out surface of the encapsulation material and the device to support the cover plate and form a large cavity. The area of the fan-out surface is used to manufacture the wall structure, so that the wall structure has enough space to widen, improve the reliability of the overall structure, reduce risks, and reduce costs.

2. The structure and method of the present disclosure, by reconstructing the wafer, make properties of the wafer no longer fragile, which is beneficial to improve the process yield of the product, facilitate processing, and reduce the risk of fragmentation.

3. The structure and method of the present disclosure increase the area of the device and reduce the non-device area. For the same piece of raw material, the number of devices is increased and the cost is reduced.

4. The structure and method of the present disclosure can adopt wafer-level packaging, which is suitable for large-scale mass production and reduces production costs to ensure the consistency of device performance.

DETAILED DESCRIPTION OF THE EMBODIMENTS

Figure 1:
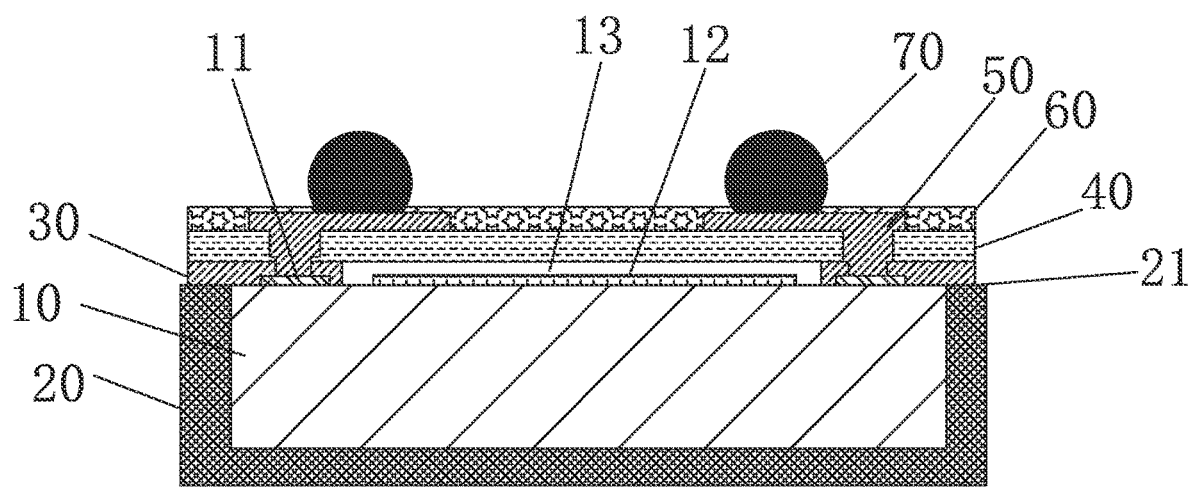
FIG. 1 illustrates a structural diagram of the present disclosure.

The present disclosure will be further described below in combination with the accompanying drawings and embodiments.

In an embodiment, a three-dimensional packaging structure for fan-out of a bonding wall of a device is provided. Referring to FIGS. 1-14, the three-dimensional packaging structure comprises a device 10, an encapsulation material 20, a wall structure 30, a cover plate 40, and a metal interconnection structure. A first surface of the device 10 is disposed with one or more bond pads 11 and a functional area 12. The functional area 12 is disposed with an interdigital transducer (IDT), and the one or more bond pads 11 can be aluminum bond pads, aluminum-nickel-gold bond pads, aluminum-nickel-palladium-gold bond pads, or the like. A chip type of the device 10 in this embodiment is a SAW filter, a bulk acoustic wave (BAW) filter, or other filter devices with similar functions, and the device 10 is diced from a wafer material such as lithium niobate, lithium tantalate, glass, or silicon.

The encapsulation material 20 encapsulates the device 10, except for the first surface of the device 10. Referring to FIG. 1, the encapsulation material 20 encapsulates four sides and a bottom side of the device 10, and a top side of the device 10 defines the first surface and is not encapsulated by the encapsulation material 20. A first surface of the encapsulation material 20 is horizontally connected with the first surface of the device 10 to form a fan-out surface 21. The encapsulation material 20 can be realized by plastic encapsulation, film laminating, or glue brushing, and a thickness of the encapsulation material 20 can be set as required. The encapsulation material 20 may be polymer, molding compound, epoxy resin, glass paste, or the like.

The wall structure 30 is disposed on an edge of the first surface of the device 10 and the fan-out surface 21 of the encapsulation material 20. The fan-out surface 21 of the encapsulation material 20 and the first surface of the device 10 are on the same plane. That is, the wall structure 30 covers a junction between the device 10 and the fan-out surface 21 of the encapsulation material 20, and the wall structure 30 can completely or partially cover the fan-out surface 21 of the encapsulation material 20.

The wall structure 30 also partially extends to cover at least one of the one or more bond pads 11, and the wall structure 30 comprises a first opening 31 corresponding to the one or more bond pads 11 and located on an upper surface of the one or more bond pads 11. An area of the first opening 31 is slightly smaller than an area of the one or more bond pads 11. The number of one or more bond pads 11 covered by the wall structure 30 may be one, two, three, or even all of one or more bond pads 11, and the disclosure is not limited herein. The wall structure 30 may be polymer, glass, ceramic, or insulator.

The cover plate 40 covers a surface of the wall structure 30 to form a cavity 13 corresponding to the functional area 12, and the cover plate 40 comprises a second opening 41 corresponding to the one or more bond pads 11. A height of the cavity 13 is determined by a thickness of the wall structure 30. The second opening 41 is in communication with the first opening 31, and an area of the second opening 41 may be slightly larger than or equal to the area of the first opening 31, preferably larger than the area of the first opening 31. The cover plate 40 can be made of materials such as polymer film, glass, silicon, or ceramic.

In this embodiment, the metal interconnection structure comprises a conductive circuit 50, a passivation layer 60, and one or more signal terminals 70. The metal interconnection structure is disposed on a surface of the cover plate 40 and extends to the second opening 41 and the first opening 31 to be electrically connected to the one or more bond pads 11. The conductive circuit 50 is insulated from the cover plate 40, is disposed on the surface of the cover plate 40, and extends to the second opening 41 and the first opening 31 to be electrically connected to the one or more bond pads 11. The conductive circuit 50 is made of a metal material. The passivation layer 60 covers exposed surfaces of the conductive circuit 50 and the cover plate 40, and the passivation layer 60 comprises a third opening 61 located on an external connection area. The one or more signal terminals 70 are located at the third opening 61 to be electrically connected to the conductive circuit 50.

The passivation layer 60 is used to protect the conductive circuit 50, and the passivation layer 60 can be made of polymer materials to improve an insulation performance of the wall fan-out device and to prevent oxidation of the conductive circuit 50. The one or more signal terminals 70 are ball grid array (BGA) solder balls, nickel-palladium-gold bond pads, nickel-gold bond pads, or titanium-copper bond pads. The metal interconnection structure of the present disclosure is not limited to the aforementioned arrangement, and other metal external connection structures known to those of ordinary skill in the art can also be used.

The device 10 may be a filter chip, and the one or more bond pads 11 are a plurality of bond pads 11 located on the first surface of the device 10. The wall structure 30 is a frame structure, and an inside of the wall structure 30 extends to cover each of the plurality of bond pads 11. The wall structure 30 comprises a plurality of first openings 31, and each of the plurality of first openings 31 corresponds to each of the plurality of bond pads 11.

A three-dimensional packaging method for the fan-out of the bonding wall of the device is illustrated in FIGS. 2-14 and is used to manufacture the above-mentioned three-dimensional packaging structure for bonding the wall fan-out device. The three-dimensional packaging method includes the following steps.

Figure 2:
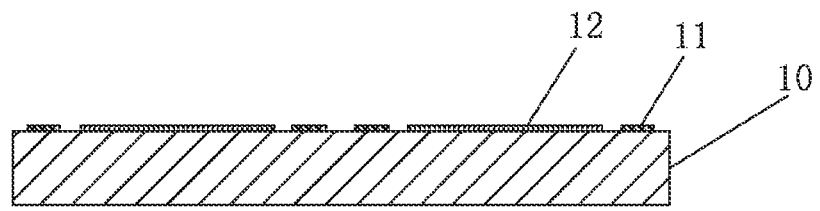
FIG. 2 illustrates a structural diagram of a device wafer.
Figure 3:
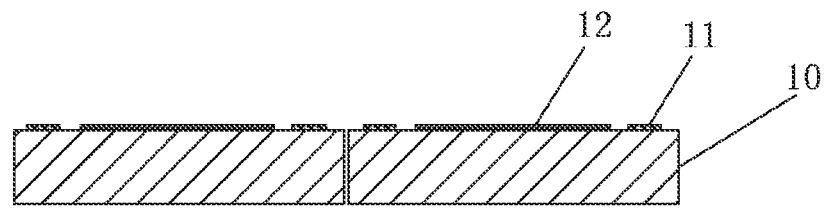
FIG. 3 illustrates a schematic diagram of the device wafer, when the device wafer has been diced.
Figure 4:
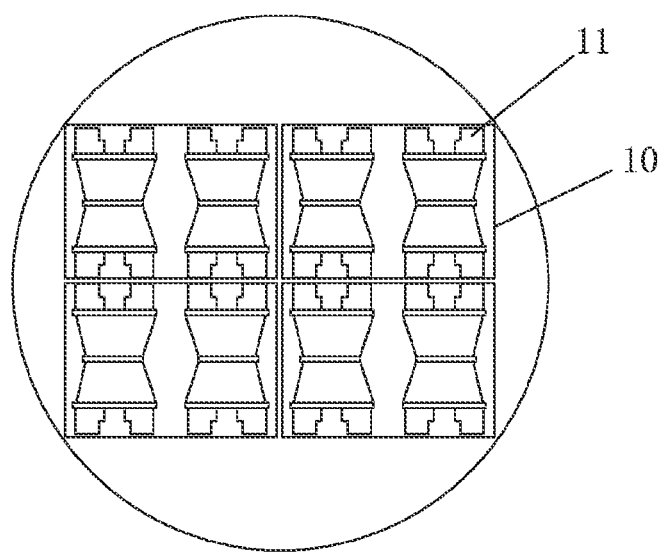
FIG. 4 illustrates a top view of FIG. 3.

1) Referring to FIG. 2, a filter device wafer is selected, and the filter device wafer is diced to obtain the device 10. The filter device wafer is a wafer such as lithium niobate or lithium carbonate, and a structure diagram after the filter device wafer is diced is shown in FIGS. 3 and 4.

Figure 5:
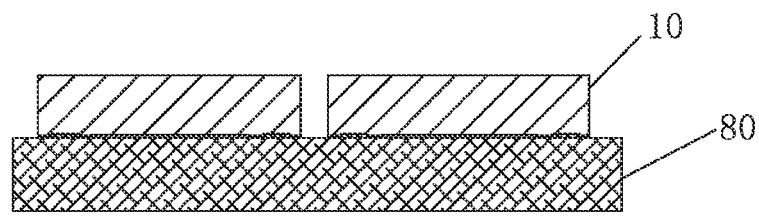
FIG. 5 illustrates a schematic diagram of placing the device wafer onto a temporary carrier.

2) Referring to FIG. 5, using alignment marks, the device 10 is placed on a temporary carrier 80 by picking and placing.

Figure 6:
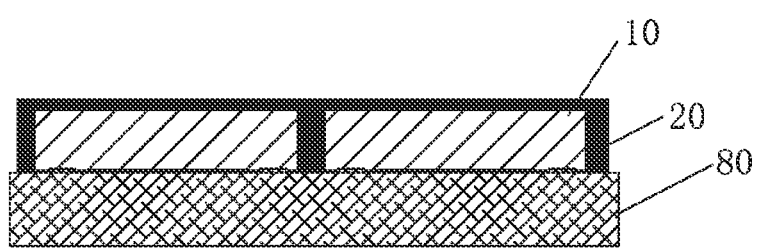
FIG. 6 illustrates a schematic diagram of encapsulation.

3) The device 10, except for the first surface of the device 10, is encapsulated by plastic encapsulation, film laminating, or glue brushing, and the first surface of the encapsulation material 20 is horizontally connected with the first surface of the device 10 to form the fan-out surface 21. Referring to FIG. 6, the encapsulation material 20 is polymer, molding compound, epoxy resin, glass paste, etc.

Figure 7:
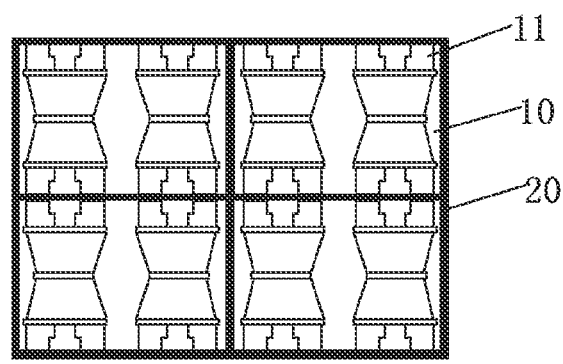
FIG. 7 illustrates a top view of FIG. 6.
Figure 8:
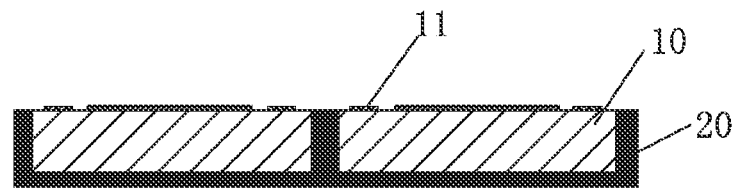
FIG. 8 illustrates a schematic diagram of debonding.

4) Referring to FIG. 7 and FIG. 8, the device 10 that has been encapsulated is separated from the temporary carrier 80. That is, the temporary carrier 80 is removed to obtain a reconstructed wafer or square plate encapsulated by the encapsulation material 20.

Figure 9:
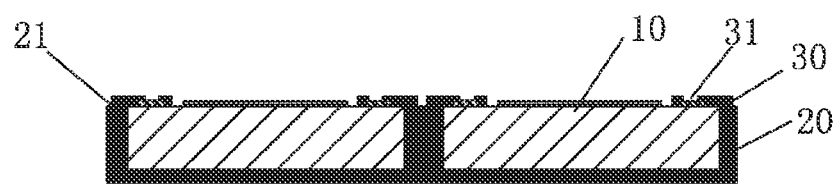
FIG. 9 illustrates a schematic diagram of preparing a wall structure.
Figure 10:
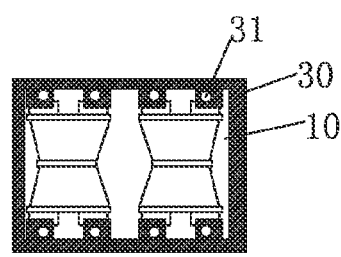
FIG. 10 illustrates a top view of FIG. 9.

5) Referring to FIG. 9 and FIG. 10, the wall structure 30 is prepared on the edge of the first surface of the device 10 and the fan-out surface 21 of the encapsulation material 20. The wall structure 30 partially extends to cover at least one of the plurality of bond pads 11, and the first opening 31 is formed at the plurality of bond pads 11. The wall structure 30 may be polymer, glass, ceramic, or insulator.

Figure 11:
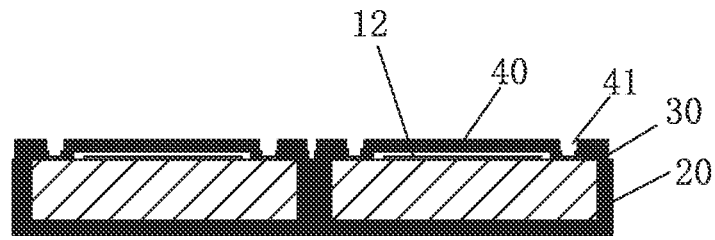
FIG. 11 illustrates a schematic diagram of preparing a cover plate.
Figure 13:
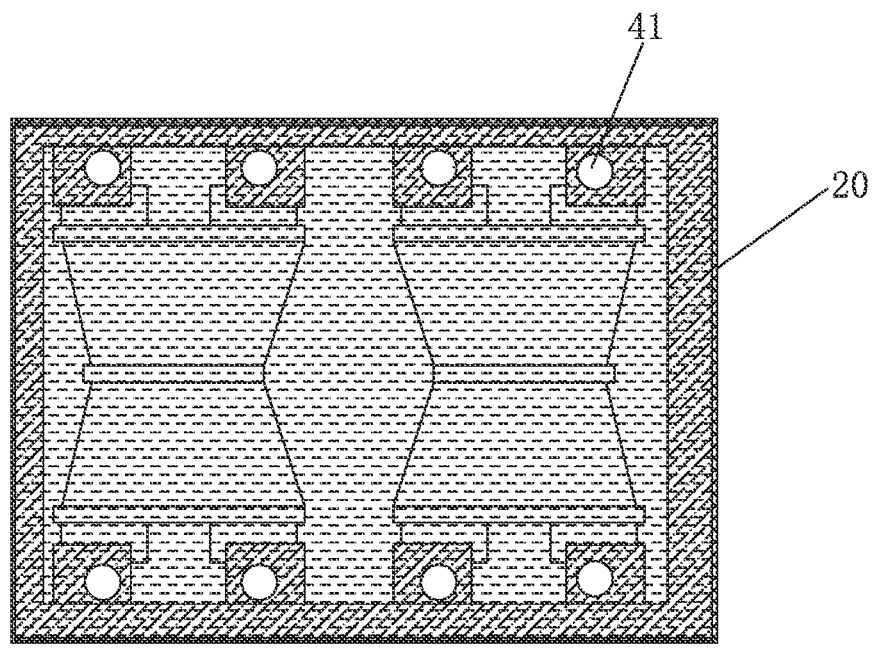
FIG. 13 illustrates a top view of FIG. 11.

6) Referring to FIG. 11 and FIG. 13, the cover plate 40 covers the surface of the wall structure 30 to form the cavity 13 corresponding to the functional area 12 of the device 10, and a second opening 41 is formed at the plurality of bond pads 11. The cover plate 40 can be made of dry film, glass, silicon, or ceramics, and the cover plate 40 can be formed with the second opening 41 by photolithography or laser.

Figure 12:
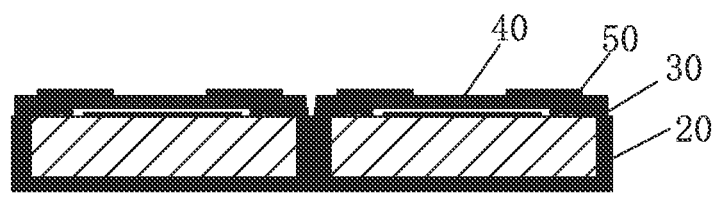
FIG. 12 illustrates a schematic diagram of installing a conductive circuit.

7) Referring to FIG. 12, the metal interconnection structure is made and electrically connected with the plurality of bond pads 11. Specifically, the conductive circuit 50 is first fabricated on the surface of the cover plate 40, extends to the second opening 41 and the first opening 31, and is electrically connected to the plurality of bond pads 11. Then, referring to FIG. 14, the passivation layer 60 is fabricated to cover the exposed surfaces of the conductive circuit 50 and the cover plate 40, and the passivation layer 60 is lithographically opened in the external connection area to form the third opening 61. The one or more signal terminals 70 are formed at the third opening 61 of the external connection area to be electrically connected with the conductive circuit 50. The one or more signal terminals 70 may be a common signal port such as BGA solder balls, nickel-palladium-gold bond pads, nickel-gold bond pads, or titanium-copper bond pads.

Figure 14:
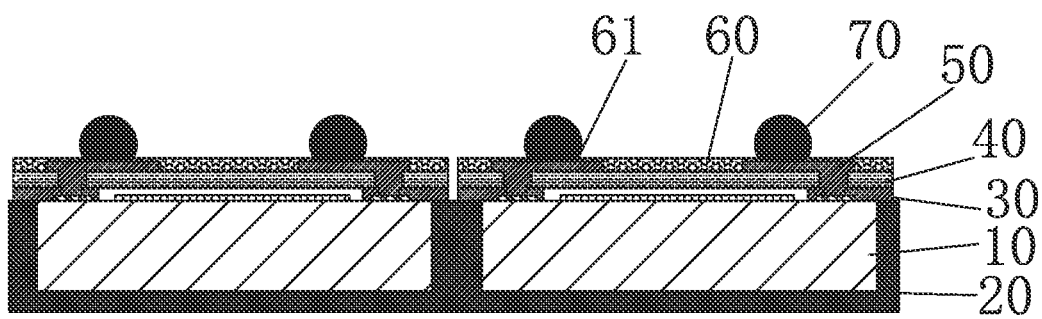
FIG. 14 illustrates a structural diagram of the present disclosure when the device wafer has not been diced.

8) Continuing to refer to FIG. 14, the reconstructed wafer or square plate is diced to obtain a final package.

The material of the wall structure of the present disclosure can be photoresist or dry film. The material is placed on the first surface of the device and the fan-out surface by glue brushing or film laminating, and the wall structure is formed by photolithography, exposure, and development. Then, the material is bonded by itself (if the material has a bonding function) or by coating glue, glass, silicon, dry film, or other materials on a surface of the material.

The reduction of chip area has become a development trend. In order to reduce the cost of chip manufacturing, the surface area of the chip outside the device will be compressed to a small amount. Correspondingly, a bonding wall left for making a cavity structure will be narrowed, and a bonding surface with the cover plate will be reduced. The reduced bonding force affects the reliability of the device. In order to meet the standardized dimensions of the package, the present disclosure proposes to solve the reliability problem of a sealed cavity wafer-level package caused by the smaller chip by fanning out the bonding wall. The present disclosure is different from the standard fan-out package that fan-out electrical metal wirings. The device is first diced and then embedded in another material. The wall structure is manufactured with the help of the fan-out area, so that the wall structure has enough position to be widened to achieve a large cavity, high reliability, and cost reduction.

The aforementioned embodiments are merely some embodiments of the present disclosure, and the scope of the disclosure is not limited thereto. Thus, it is intended that the present disclosure cover any modifications and variations of the presently presented embodiments provided they are made without departing from the appended claims and the specification of the present disclosure.

What is claimed is:

1. A three-dimensional packaging structure for fan-out of a bonding wall of a device, wherein:
    a first surface of the device is disposed with a plurality of bond pads and a functional area,
    the device, except for the first surface of the device, is encapsulated with an encapsulation material that is integrally molded,
    a first surface of the encapsulation material aligned with the first surface of the device forms a fan-out surface,
    a wall structure is disposed on the first surface of the device and extends to the fan-out surface,
    the wall structure covers a part of a surface of at least one of the plurality of bond pads away from the device and comprises a first opening corresponding to the at least one of the plurality of bond pads,
    a cover plate is bonded with the wall structure to form a cavity corresponding to the functional area and comprises at least one second opening in communication with the first opening,
    the at least one of the plurality of bond pads, the first opening, and the at least one second opening are overlapped, and
    a metal interconnection structure is disposed on a surface of the cover plate and is electrically connected to a remaining part of the surface of the at least one of the plurality of bond pads away from the device through the first opening and the at least one second opening.

2. The three-dimensional packaging structure for the fan-out of the bonding wall of the device according to claim 1, wherein:
    the cover plate is made of polymer film, glass, silicon, or ceramic.

3. The three-dimensional packaging structure for the fan-out of the bonding wall of the device according to claim 1, wherein:
    a material of the wall structure is polymer, glass, ceramic, or insulator.

4. The three-dimensional packaging structure for the fan-out of the bonding wall of the device according to claim 1, wherein:
    a material of the wall structure is photoresist or dry film,
    the material of the wall structure is disposed on the first surface of the device and the fan-out surface by glue brushing or film laminating, and
    the wall structure is formed by photolithography, exposure, and development.

5. The three-dimensional packaging structure for the fan-out of the bonding wall of the device according to claim 1, wherein:
    a material of the device is lithium niobate, lithium tantalate, glass, or silicon.

6. The three-dimensional packaging structure for the fan-out of the bonding wall of the device according to claim 1, wherein:
    the encapsulation material is a polymer, a molding compound, an epoxy resin, or a glass paste.

7. The three-dimensional packaging structure for the fan-out of the bonding wall of the device according to claim 1, wherein:
    the three-dimensional packaging structure is formed by one or more filter devices.

8. The three-dimensional packaging structure for the fan-out of the bonding wall of the device according to claim 1, wherein:
    the metal interconnection structure comprises a conductive circuit, a passivation layer, and one or more signal terminals,
    the conductive circuit is insulated from the cover plate,
    the conductive circuit is disposed on the surface of the cover plate and extends to the at least one second opening and the first opening to be electrically connected to the plurality of bond pads,
    the passivation layer covers exposed surfaces of the cover plate and the conductive circuit and comprises a third opening, and
    the one or more signal terminals are located at the third opening to be electrically connected to the conductive circuit.

9. The three-dimensional packaging structure for the fan-out of the bonding wall of the device according to claim 8, wherein:
    the one or more signal terminals are ball grid array (BGA) solder balls, nickel-palladium-gold bond pads, nickel-gold bond pads, or titanium-copper bond pads.

10. The three-dimensional packaging structure for the fan-out of the bonding wall of the device according to claim 4, wherein:
    the device is a filter chip with the plurality of bond pads disposed on the first surface of the device,
    the wall structure is a frame structure,
    an inside of the wall structure correspondingly extends to cover each of the plurality of bond pads, and
    each of the plurality of bond pads is provided with the first opening.

11. The three-dimensional packaging structure for the fan-out of the bonding wall of the device according to claim 2, wherein:
    a material of the wall structure is photoresist or dry film,
    the material of the wall structure is disposed on the first surface of the device and the fan-out surface by glue brushing or film laminating, and the wall structure is formed by photolithography, exposure, and development.

12. The three-dimensional packaging structure for the fan-out of the bonding wall of the device according to claim 1, wherein:
a length of the first opening is less than a length of the at least one of the plurality of bond pads and a length of the at least one second opening in a cross section.

13. A three-dimensional packaging method for fan-out of a bonding wall of a device, comprising:
1) dicing a device wafer to obtain the device, and the device comprising a plurality of bond pads,
2) placing the device on a temporary carrier by picking and placing,
3) encapsulating the device to form a fan-out surface that is defined by a first surface of an encapsulation material aligned with a first surface of the device,
4) separating the device, that has been encapsulated, from the temporary carrier to obtain a reconstituted wafer or square plate with the encapsulation material,
5) fabricating a wall structure on an edge of the first surface of the device and the fan-out surface, the wall structure partially covering a part of a surface of at least one of the plurality of bond pads away from the device, and the wall structure comprising a first opening corresponding to the at least one of the plurality of bond pads,
6) adding a cover plate on a surface of the wall structure to form a cavity corresponding to a functional area, the cover plate comprising a second opening corresponding to the at least one of the plurality of bond pads, wherein the at least one of the plurality of bond pads, the first opening, and the at least one second opening are overlapped, and
7) fabricating a metal interconnection structure electrically connected with a remaining part of the surface of the at least one of the plurality of bond pads away from the device.

14. The three-dimensional packaging method for the fan-out of the bonding wall of the device according to claim 13, wherein:
the step 3 comprises: encapsulating the device by plastic encapsulation, film laminating, or glue brushing.

15. The three-dimensional packaging method for the fan-out of the bonding wall of the device according to claim 13, wherein:
a material of the wall structure is photoresist or dry film, and
the step 5 comprises:
placing the material of the wall structure on the first surface of the device and the fan-out surface by glue brushing or film laminating, and
forming the wall structure by photolithography, exposure, and development.

16. The three-dimensional packaging method for the fan-out of the bonding wall of the device according to claim 15, wherein:
when the wall structure undergoes photolithography:
the wall structure covers a part of an area of the at least one of the plurality of bond pads, and the first opening is reserved, and
when the cover plate has been bonded:
the second opening is formed by the cover plate being opened at a position corresponding to the at least one of the plurality of bond pads through photolithography or laser, and
the at least one of the plurality of bond pads is led to a surface of the cover plate through wires that are prepared through physical vapor deposition (PVD) or electroplating.

17. The three-dimensional packaging method for the fan-out of the bonding wall of the device according to claim 13, wherein:
a length of the first opening is less than a length of the at least one of the plurality of bond pads and a length of the at least one second opening in a cross section.

* * * * *